United States Patent [19] [11] 3,765,984
Strehlow [45] Oct. 16, 1973

[54] APPARATUS FOR CHEMICALLY POLISHING CRYSTALS

[75] Inventor: Wolfgang H. Strehlow, St. Paul, Minn.

[73] Assignee: Minnesota Mining and Manufacturing Company, St. Paul, Minn.

[22] Filed: Dec. 14, 1970

[21] Appl. No.: 98,097

Related U.S. Application Data

[62] Division of Ser. No. 745,618, July 17, 1968, Pat. No. 3,629,023.

[52] U.S. Cl. .................................. 156/345, 156/17
[51] Int. Cl. .................................. B28d 5/00
[58] Field of Search .................................. 156/17, 345

[56] References Cited

UNITED STATES PATENTS 3,383,255 5/1968 Rossi et al. .................................. 156/345
3,436,286 4/1969 Lange .................................. 156/345

*Primary Examiner*—J. Steinberg
*Attorney*—Kinney, Alexander, Sell, Steldt & Delahunt

[57] ABSTRACT

A method and apparatus for chemically polishing crystals of the group II(b) – VI(a) system of the periodic table using a mixture consisting essentially of bromine and methanol with the bromine being present in the amount within the range of about 0.05 to about 10 percent by volume of the total solution of the mixture and forming a moving fluid film of the mixture to polish the crystal surface is shown. The apparatus includes a polishing dish and crystal support disk which supports the crystal to be polished and positions the crystal surface to be polished adjacent a plate which forms part of the polishing dish and a dispensing means which supplies a polishing solution between the plate and crystal surface for establishing a fluid film therebetween to chemically polish the crystal surface.

3 Claims, 2 Drawing Figures

APPARATUS FOR CHEMICALLY POLISHING CRYSTALS

Figure 2:
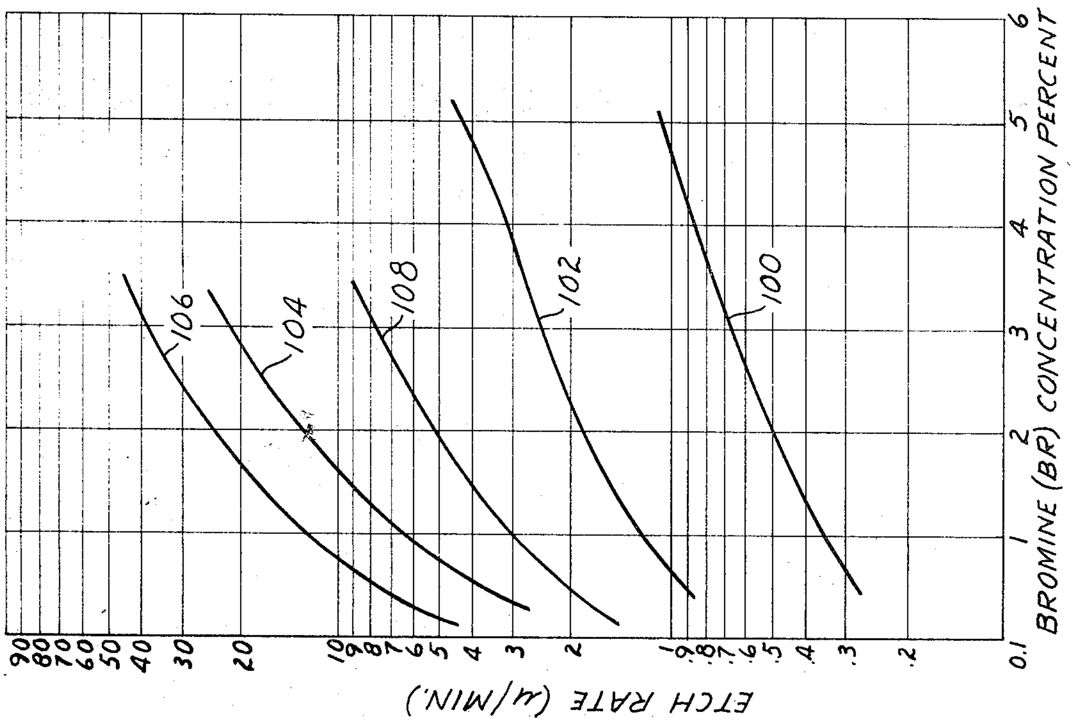

This is a division of application Ser. No. 745,618, filed July 17, 1968, now U.S. Pat. No. 3,629,023.

This invention relates to a method and apparatus for chemically polishing crystals of the group II(b) – VI(a) system for use in a device for producing electromagnetic radiation by stimulated emission. It is known that certain semiconductor crystals may be fabricated into crystal wafers which, after suitable preparation, will exhibit laser action when excited by certain energy sources, for example, an electron beam. The surface which is bombarded by an electron beam must have certain characteristics to enable the crystal wafer to properly accept electron beam energy. Mechanical polishing of a crystal wafer surface usually damages the crystal lattice to a depth of several microns or greater. The damaged crystal surface is known as a "destruction layer" and will greatly interfere with the ability of the crystal wafer to utilize energy from the electron beam.

Further, certain applications relating to semiconductor devices and laser materials require semiconductor surfaces characterized by substantially undamaged crystal lattices. Such surfaces must be substantially free of destruction layer defects.

Techniques for removing destruction layers from mechanically polished surfaces of certain crystal materials are known to the art. An electropolishing technique was reported by M. V. Sullivan et al., *Journal of the Electrochemical Society*, Volume 110, No. 5, page 412, 1963. U.S. Pat. Nos. 2,640,767; 2,827,367; 2,849,296 and 2,927,011 related to various etching solutions containing organic or inorganic acids as the active ingredients. U.S. Pat. Nos. 3,156,596 and 3,262,825 relate to methods for etching the surfaces of group III(a) – V(a) compounds with halogen-solvent solutions. Halogen-solvent solutions are advantageous polishing solutions for crystals of III(a) – V(a) compounds; however, it was entirely unexpected that these solutions could be utilized for II(b) – VI(a) compound crystals because of the distinct difference between the III(a) – V(a) and II(b) – VI(a) compounds. In particular, the II(b) – VI(a) compounds have a higher amount of ionic character in the bonding thereof than do the III(a) – V(a) compounds. Also, acid etchants can be used to remove destruction layers from the surfaces of certain crystals; such etchants cause pits and grooves to form in the etched surfaces of II(b) – VI(a) compounds which cannot be tolerated.

The present invention is based upon the discovery that certain surfaces of crystals of group II(b) – VI(a) compounds may be advantageously polished and the destruction layers removed therefrom by wetting the crystal with a mixture consisting essentially of bromine and methanol with the bromine being present in the amount within the range of about 0.05 to about 10 percent by volume of the total solution of the mixture and forming a moving fluid film of the mixture by relative movement between a polishing surface and the crystal surface being polished.

The polishing solution of the present invention acts primarily upon surfaces normal to the growth axes of group II(b) – VI(a) crystal compounds. Hexagonal wafers may be formed by slicing group II(b) – VI(a) crystals in planes normal to the growth, or C-axes, of the crystals. When such wafers are treated with a selected polishing solution of the present invention, at least one hexagonal surface thereof will be rendered smooth and substantially free of destruction layer defects. The polishing solution acts upon both surfaces normal to the hexagonal axis or C-axis of certain II(b) – VI(a) crystal wafers, for example, cadmium selenide, whereas only one such surface of crystal wafers of certain other group II(b) – VI(a) compounds, such as zinc oxide, will be affected.

The primary advantage of the present invention is that group II(b) – VI(a) crystals may be produced having at least one surface which is substantially free from destruction layer defects.

Another advantage of the present invention is that group II(b) – VI(a) crystals may be produced having surfaces exhibiting low surface roughness.

A further advantage of the present invention is that crystal wafers can be chemically polished by a novel apparatus disclosed herein.

Figure 1:
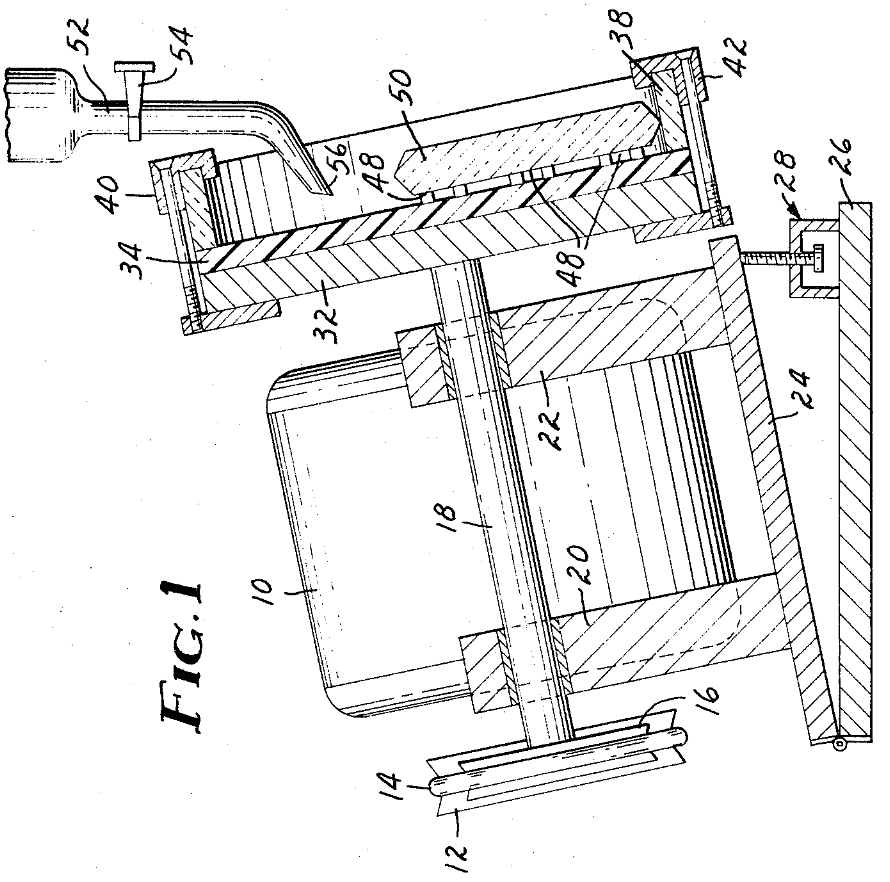

These and other advantages of the present invention can be determined with reference to the accompanying reference and drawing wherein:

FIG. 1 is a diagrammatic representation partially in block form of apparatus for polishing crystals according to the method disclosed herein with the polishing solution disclosed herein; and FIG. 2 is a graph illustrating the etching rate plotted as a function of bromine concentration of the mixture for several crystals of the group II(b) – VI(a) system of the periodic chart.

Briefly, a method for chemically polishing crystals of the group II(b) – VI(a) system of the periodic table is disclosed. The method comprises the step of wetting the crystals with a mixture consisting essentially of bromine and methanol wherein the bromine is present in the amount within the range of about 0.05 to about 10 percent by volume of the total solution of the mixture and forming a moving fluid film of said mixture by relative movement between a polishing surface and the crystal surface being polished to uniformly polish the crystal surface at a controlled rate. In addition, also disclosed is an apparatus for chemically polishing crystals which comprises a rotatable annular-shaped plate which forms a polishing dish, a relatively thin, planar, annular-shaped crystal support disk which has the crystal mounted thereon and which is positioned within the dish with the crystal surface to be polished adjacent the plate such that the outer edge of the support disk releasably engages the polishing dish and is rotated by coaction therewith, a means for driving the polishing dish and a means for selectively dispensing polishing solution between the plate and crystal surface enabling a fluid film to be formed therebetween which polishes the crystal surface by a dissolving action established by the relative motion between the plate and crystal surface.

The preferred crystals utilized in this invention are hexagonal crystals of the group II(b) – VI(a) system of the periodic table. The polishing method and apparatus for chemically polishing crystals disclosed herein is effective for the more common hexagonal II(b) – VI(a) crystals such as, for example, zinc oxide, zinc sulfide, cadmium selenide and cadmium sulfide. Such crystals have wide utility such as, for example, cavity materials for electron beam lasers.

It is contemplated that the method and apparatus disclosed herein can be used to chemically polish other crystals of the group II(b) – VI(a) system for use in electron beam lasers including cubic crystals such as, for example, cadmium telluride, zinc telluride, zinc selenide, mercury selenide and mercury telluride.

These crystals can be fabricated by known techniques such as by vapor growing techniques in furnaces. Thus, a description of crystal preparation need not be con-sidered in detail.

The fabricated crystals which are to be utilized are either in bulk form or one crystal platelet. Usually a crystal wafer is carved or sliced from a bulk crystal or crystal platelet using conventional techniques. Thereafter, the resulting crystal wafer, or if desired a complete crystal platelet, is then mechanically polished to approximately the desired crystal thickness. Any one of many known mechanically polishing techniques can be used. For purpose of example, the following mechanical polishing technique is presented.

In one preparation method, during mechanical polishing, the crystal wafer, which in this example may be a zinc oxide crystal, is attached to a glass support by means of an adhesive such as Canada balsam. The zinc oxide crystal is initially mechanically polished, for example, by 600-grit sandpaper until the axial thickness of the wafer is about 500 microns. The wafer may be then polished utilizing three-micron diamond dust supported in a nylon backing until the crystal is water clear. Finally, the wafer is polished on a water-covered micro-cloth having a 0.05-micron aluminum oxide powder as the abrasive member. The wafer is polished down to relatively smooth optically flat surfaces, and washed with water to remove any residue which may be clinging to the surface thereof from the polishing step. Thereafter, the crystal wafer is chemically polished by the apparatus of FIG. 1 which will now be described.

FIG. 1 is a diagrammatic representation of apparatus adapted for practicing the method of this invention. The apparatus comprises a direct current motor 10 having a pulley 12 connected to the armature thereof. The pulley 12 is connected via a belt 14 to a smaller diameter pulley 16 connected to the end of a rotatably mounted shaft 18. The shaft 18 is supported by two supports 20 and 22 which are in turn secured to a movable base member 24 which is pivotally hinged at one end thereof to a fixed base 26. An adjustable height member 28 permits adjustment of the movable base member 24 relative to the fixed base 26.

The supports 20 and 22 are journalled to support shaft 18 in a manner so as to minimize shaft vibration. An annular-shaped plate is formed of a high inertia material, such as a cast iron plate 32 and a Lucite plate 34. Lucite is the trade name for a brand of polymethyl methacrylate. The cast iron plate is about 8 inches (about 20 cm) in diameter and is rigidly connected to shaft 18. The Lucite plate 34 is about 8 inches (about 30 cm) in diameter and about 0.25 inch (about 1 cm) thick and is mounted as a laminate coaxially with the cast iron plate 32 and shaft 18 to form a rotatable annular-shaped plate. A glass cylinder 38 having an outside diameter in the order of 8 inches (about 20 cm), a relatively thin outer wall of about 0.5 inch (about 1 cm) and an axial length of about 0.75 inch (about 2 cm) is positioned on and in coaxial alignment with the lucite plate 34. The glass cylinder 38 forms an outer raised edge extending circumferentially around the plate formed of cast iron plate 32 and the Lucite plate 34 forming a polishing dish. In this embodiment, the glass cylinder 38 and Lucite plate 34 are clamped via clamps 40 and 42 to the cast iron plate 32. However, if desired, the Lucite plate 34 can be mounted onto the cast iron plate 32 and the glass cylinder 38 can be mounted onto the Lucite plate 34 by means of an adhesive.

The crystal wafers 48 to be polished are wax-mounted on a flat Pyrex disk 50 of about 5 inches (about 12 cm) diameter and about 0.75 inch (about 2 cm) in thickness. Pyrex is the trade name of a commercially available borosilicate glass. The crystal surface to be polished is adjacent the surface of the Lucite plate 34. The edge of the Pyrex disk 50 releasably engages the inside edge of the glass cylinder 38 such that when the shaft is driven clockwise (CW), the Pyrex disk 50 rotates clockwise (CW) due to the coacting driving relationship established by the outer edge of the Pyrex disk 50 and the inner surface of glass cylinder 38.

A flask or container 52, adapted to contain a polishing solution, has a control valve 54 and a spout 56 which directs the polishing solution at a controlled rate onto the Lucite plate 34 and the surface of crystals 48.

As the motor 10 drives the shaft 18, cast iron plate 32, Lucite plate 34, glass cylinder 38 and Pyrex disk 50, the polishing solution flows between the surface of Lucite plate 34 and the surface of crystal 48 being polished. As the assembly is rotated at a controlled RPM and polishing solution is applied thereto at a controlled rate, a moving fluid film of the solution or mixture is formed on the surface of the crystal being chemically polished to uniformly polish the surface at a controlled rate. Also, the entire polishing apparatus can be tilted at a suitable driving angle by adjusting the angle between movable base member 24 and fixed base 26 by the adjustable height member 28. Chemical polishing of the crystal surface occurs due to the dissolving action of the moving fluid film established by the relative motion between the surface of the Lucite plate 34 and the crystal 48.

Generally, it was determined that rotation of the polishing dish at about 100 RPM and feeding the mixture or solution from container 52 at a rate of about 10 ml/minute provided acceptable polish of the crystals of the group II(b) – VI(a) system of the periodic table.

The rapidity with which material is removed from the surface of a group II(b) – VI(a) crystal wafer by the method of the present invention is dependent upon certain parameters such as the nature of the surface to be attacked and the temperature, agitation rate and composition of the polishing solution. Increase in the agitation rate and temperature of the polishing solution cause corresponding increases in the rate at which material is removed. Similarly, increases in the rate of material removal accompany increases in the concentration of bromine in the polishing solution. It has been found that the activity of the bromine component greatly contributes to the reactivity of the solution. When using a bromine-methanol solution for chemical polishing, it is desirable to prepare and immediately use the polishing solution. If the polishing solution is not used immediately, in a relatively short period of time, in the order of hours, the solution becomes ineffective.

Undoped crystals of cadmium selenide (CdSe), zinc oxide (ZnO) and zinc sulfide (ZnS) crystals were aligned by means of x-ray diffraction to less than 15 minutes of an arc and cut perpendicular to the C-axis. The crystals were first mechanically polished as described herein and then chemically polished by the apparatus of FIG. 1. The following examples are provided.

Example I

A "c"-cut zinc oxide crystal of about 500 μ thickness, which was first mechanically polished, had its zinc face and oxygen face verified by etch figures using methods known in the art. An excellent surface finish of the oxygen face of the ZnO was obtained with a solution of bromine in methanol wherein bromine is present in amounts within a range of about 0.5 percent to in excess of 5 percent by volume of the total solution of the mixture. A curve 100 in FIG. 2 illustrates the etch rate of the oxygen face of the zinc oxide plotted as a function of the percentage volume of bromine in methanol. It was determined that a solution of bromine in the order of about 1 to 2 percent by volume yields a convenient etch rate which removes the destruction layer and results in a very smooth surface. An excellent surface finish of the oxygen face of the ZnO was obtained. The zinc surface of the ZnO did not appear to be chemically polished.

Example II

A "c"-cut zinc sulfide crystal of about 500 μ thickness, which was first mechanically polished, had its zinc face and sulfur face verified by etch figures using methods known in the art. An excellent surface finish of the sulfur face of the ZnS was obtained with a solution of bromine in methanol wherein bromine is present in amounts within a range of about 0.5 percent to in excess of 5 percent by volume of the total solution of the mixture. A curve 102 in FIG. 2 illustrates the etch rate of the sulfur face of the ZnS plotted as a function of the percentage volume of bromine in methanol. It was determined that a solution of bromine in the order of about 1 to 2 percent by volume yields a convenient etch rate which removes the destruction layer and results in a good finish of the sulfur face. The surface etch rate of the zinc surface was less than 0.1 μ/minute in a 5 percent bromine solution.

Example III

A "c"-cut cadmium selenide crystal of about 500 μ thickness, which was first mechanically polished, had its cadmium face and selenium face verified by etch figures using methods known in the art. A smooth shiny surface finish on the cadmium face and the selenium face of the CdSe was obtained with a solution of bromine in methanol Wherein bromine is present in amounts within a range of about 0.5 percent to in excess of about 3 percent by volume of the total solution of the mixture. In FIG. 2, curve 104 illustrates the etch rate of the cadmium face and curve 106 illustrates the etch rate of the selenium face of the CdSe plotted as a function of the percentage volume of bromine in methanol. It was determined that a solution of bromine in the order of about 0.5 percent by volume yields a convenient etch rate which removes the destruction layer and results in a good finish of each surface. Contrary to the observations on ZnO and ZnS, a sizeable etch rate on the group II(b) face of the crystal was detected.

Example IV

A "c"-cut cadmium sulfide crystal of about 500 μ thickness, which was first mechanically polished, had its cadmium face and sulfur face verified by etch figures using known methods in the art. The destruction layer was removed from the cadmium face of the CdS with a solution of bromine in methanol wherein bromine is present in amounts within a range of about 0.5 percent to in excess of 5 percent by volume of the total solution of the mixture. A curve 108 in FIG. 2 illustrates the etch rate of the cadmium face of the CdS plotted as a function of the percentage volume of bromine in methanol. The sulfur face was less uniformly attacked, and the crystal wafers covered with a yellow, greasy layer which was removed. A 1 percent bromine in methanol etchant removed about 12 μ/minute from the sulfur surface.

As disclosed in the above examples, the polishing solution of this invention polishes and removes the destruction layers from the C-surfaces of group II(b) – VI(a) crystal wafers, the other surfaces of the crystals remaining substantially unaffected.

In the example of zinc oxide, only the minus-C-surface was affected thereby permitting one to determine the original orientation of the crystal wafer with respect to the growth or plus-C-direction of the bulk crystal from which the crystal wafer is sliced. When a crystal wafer is carved or sliced from a parent crystal, it is known that the wafer will exhibit two distinctly separate surfaces. The minus-C-surface of the crystal wafer will be oxygen rich and the plus-C-surface will be zinc rich. The oxygen-rich surface is much more vulnerable to attack by the bromine than is the zinc-rich surface and consequently the oxygen-rich surface is selectively polished.

If, on the other hand, the group II(b) – VI(a) crystal wafer is cadmium selenide, the polishing solution of this invention appears to attack both C-surfaces to approximately the same degree.

It has been determined that the rate of polishing action can be increased by increasing the percentages of bromine up to about 10 percent. Above 10 percent, it becomes difficult to obtain a polished surface of desired flatness. Overall, it was found preferable to have the percentage of bromine between about 0.05 percent up to about 3 percent with about 1 to 2 percent most preferred for the hexagonal crystals, such as for example zinc oxide.

In summary, in the crystals of the group II(b) – VI(a) system of the periodic table, the experimental results of FIG. 2 indicate that with a decreasing ionic character, the difference of the etch rates on the group VI(a) and group II(b) faces decreases. It appears that the higher electron density in the case of ZnO, and to a lesser extent of ZnS, near the group VI atoms of the surfaces causes the higher etch rate of an electron-seeking etchant on the surface. In the case of CdSe, the bond is more covalent and the increase in electron density near the Se atom due to the difference in electron negativity is small. The polishing rate of electron-seeking etchants on the Cd surface is therefore a measurable fraction of the one on the Se surface.

A preferred embodiment of polishing solution for practicing the present invention and which is adapted for polishing at least one surface of a crystal of the group II(b) – VI(a) system of the periodic table consists essentially of bromine and methanol wherein the bromine is present in the amount within the range of about 0.05 to about 10 percent by volume of the total solution.

The polishing solution of the present invention may be used to polish roughly-cut surfaces of group II(b) – VI(a) crystal wafers. Preferably, however, such surfaces are first mechanically ground substantially flat and smooth and subsequently are contacted or wetted with the polishing solution or mixture to affect removal of the destruction layer and to further smoothen the surfaces.

What is claimed is:

1. Apparatus for chemically polishing crystals comprising

I. a rotatable circular polishing dish consisting essentially of a circular plastic plate, a glass cylinder, having substantially the same diameter as said plate and a relatively thin wall retained in concentric position to said plate, overhanging the edge of said plate and forming an outer raised edge extending around the circumference of said plate;

II. a relatively thin planar circular support disk having an outer diameter which is less than the inner diameter of said polishing dish and which is adapted to have the crystal mounted thereon with the crystal surface to be polished facing away from said support disk, said disk containing said crystal being adapted to be positioned within said polishing dish with said crystal surface adjacent said plate and with the outer edge of said support disk releasably engaging the inner surface of said raised edge of said polishing dish;

III. a means operatively connected to said circular plastic plate for driving said polishing dish at a driving angle to rotate said support disk by coaction between the outer edge of said support disk and the inner surface of said raised edge; and IV. means adapted to contain a polishing solution positioned external to said polishing dish for selectively dispensing polishing solution between said plate and said crystal surface enabling a fluid film to be formed therebetween which polishes said crystal surface by a dissolving action established by the relative motion between the plate and said crystal surface.

2. The apparatus of claim 1 wherein said circular plastic plate is formed of polymethylmethacrylate and is laminated to a high inertia material and said support dish is formed of borosilicate glass.

3. The apparatus of claim 2 wherein said driving means includes a shaft coaxially rigidly mounted to said high inertia material;

support means journalled to said shaft for rotatably supporting said shaft for minimizing shaft vibration; and means operatively connected to said shaft for rotating said shaft at a predetermined rate.

* * * * *